(12) United States Patent
Hamada et al.

(10) Patent No.: US 6,339,555 B1
(45) Date of Patent: Jan. 15, 2002

(54) SEMICONDUCTOR MEMORY DEVICE ENABLING TEST OF TIMING STANDARD FOR STROBE SIGNAL AND DATA SIGNAL WITH EASE, AND SUBSIDIARY DEVICE AND TESTING DEVICE THEREOF

(75) Inventors: Mitsuhiro Hamada; Kenichi Yasuda, both of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/759,358

(22) Filed: Jan. 16, 2001

(30) Foreign Application Priority Data

Jul. 24, 2000 (JP) ............................................. 12-222041

(51) Int. Cl.[7] ................................................. G11C 7/00
(52) U.S. Cl. ........................................ 365/201; 365/194
(58) Field of Search ................................. 365/201, 194, 365/233, 233.5

(56) References Cited

U.S. PATENT DOCUMENTS 5,793,685 A * 8/1998 Suma ........................ 365/201
5,995,424 A * 11/1999 Lawrence et al. .......... 365/201
6,061,282 A * 5/2000 Tamaki ...................... 365/201

FOREIGN PATENT DOCUMENTS

| JP | 4-198773 | 7/1992 |
| JP | 10-73642 | 3/1998 |

* cited by examiner

Primary Examiner—Tan T. Nguyen
(74) Attorney, Agent, or Firm—McDermott, Will & Emery

(57) ABSTRACT

A first delay circuit for delaying a data signal IND output from a memory circuit and a second delay circuit for delaying a strobe signal INS, and a latch circuit for latching data according to the outputs of the first and the second delay circuits are provided as a test circuit inside a DDR SDRAM. A tester can observe results of latching by the latch circuit to facilitate determination whether the data signal and the strobe signal have a correlation adapted to a standard. Accordingly, such a DDR SDRAM can be provided that is capable of conducting an examination whether the device meets a tDQSQ standard defining a correlation between the strobe signal DQS and the data signal DQ with ease.

20 Claims, 16 Drawing Sheets

SEMICONDUCTOR MEMORY DEVICE ENABLING TEST OF TIMING STANDARD FOR STROBE SIGNAL AND DATA SIGNAL WITH EASE, AND SUBSIDIARY DEVICE AND TESTING DEVICE THEREOF

BACKGROUND OF THE INVENTION

1. Field of the Invention

The present invention relates to a semiconductor memory device and a semiconductor memory device testing method and, more particularly, to a double data rate synchronous dynamic random access memory (DDR SDRAM) and a testing method thereof.

2. Description of the Background Art

Semiconductor memory devices have their performance verified by a testing device called tester at a final stage of their production process.

FIG. 15 is a diagram for use in explaining performance verification by a conventional tester.

With reference to FIG. 15, a tester 202 applies, to a memory device 204 to be tested, control signals /RAS, /CAS, /WE, an address signal ADD and a data input signal DIN to observe a data output signal DOUT output by the memory device 204.

The tester 202 includes a timing generator 206 for generating a timing reference signal for the test, a signal generator 208 for outputting the control signals, the address signal and the data input signal in response to the output of the timing generator 206, and a determination 210 for observing the data output signal DOUT output by the memory device 204 with the output of the timing generator 206 as a reference of time to determine whether the memory device 204 operates normally.

FIG. 16 is an operation waveform diagram for use in explaining a conventional performance verification test of a semiconductor memory device.

With reference to FIGS. 15 and 16, at time t1, the tester 202 causes the control signal /RAS to fall, so that the memory device 204 accepts a row address signal X. Then, The control signal /WE is set at a logical low or "L" level by the tester 202 and the memory device 204 is supplied with data DATA to be written by the data input signal DIN.

At time t2, the control signal /CAS is caused to fall and the memory device 204 responsively accepts a column address Y. Then, the memory device 204 writes the write data DATA in a memory cell designated by the row address and the column address.

Such writing cycle will be repeated as many times as the number corresponding to the memory capacity.

Next, a reading cycle for reading data will be described. When data writing ends, the control signal /RAS is caused to fall at time t3, so that the row address X is accepted into the memory device 204. Subsequently, the control signal /WE is set at a logical high or "H" level to designate data reading of the memory device 204.

At time t4, the control signal /CAS is caused to fall, so that the column address Y is accepted into the memory device 204.

Responsively, at time t5, from the memory cell designated by the row address X and the column address Y, the read data DATA is transmitted as a data output signal from the memory device 204 to the tester 202. Determination is made by the determination unit 210 whether the output data coincides with the written data. Thus, determination is made whether the memory device 204 is defective or not.

In recent years, with the speed-up of semiconductor memory devices, there has appeared a synchronous semiconductor memory device whose data input/output is controlled in synchronization with a clock signal, that is, a synchronous dynamic random access memory (SDRAM) and further, a higher-speed DDR SDRAM has appeared which transmits data at a data rate equivalent to both of leading and trailing edges of a clock signal.

FIG. 17 is a waveform diagram for use in explaining one of standards for a DDR SDRAM.

With reference to FIG. 17, the DDR SDRAM outputs a data signal DQ, as well as outputting a strobe signal DQS in synchronization with the data signal DQ. The strobe signal DQS is used as a reference signal for accepting the data signal DQ by a controller or the like, which receives data output by a memory device.

The strobe signal DQS is a signal for use as a solution of a skew between a clock signal and a data signal. Since the data signal DQ and the strobe signal DQS have the same signal transmission direction, skew is reduced. To enhance the effect, a transmission path of the data signal DQ and that of the strobe signal DQS on a printed-circuit board are formed to be approximately equal in length.

With the timing of a rise and a fall of the strobe signal DQS output from the DDR SDRAM as an origin, timing of output of the data signal DQ output similarly by the DDR SDRAM is defined. One of the standards for the timing is called tDQSQ standard.

For example, FIG. 17 shows a case where four data D1 to D4 is successively output from the DDR SDRAM. A time difference between a time of a transition from the data D1 to the data D2 when the data is successively output and a time of the strobe signal DQS is defined by the tDQSQ standard. A time tDQSQmax denotes a maximum allowed time of delay in the data D1 determination behind a time of a rise of the strobe signal DQS. In other words, the data D1 should be defined within a time denoted by tDQSQmax after the time of a rise of the strobe signal DQS and similarly the data D2 should be defined within the tDQSQmax after a time of a fall of the strobe signal DQS.

On the other hand, there is a case where output of the data signal DQ is earlier in time than an edge of the strobe signal DQS. In this case, a time of output of the data D3 should not be earlier by a time denoted by a tDQSQ min than an edge of the strobe signal DQS.

The tDQSQ standard should be satisfied in all the output cycles of data from the memory device. In a case of a 256-Mbit 8-bit-basis DDR SDRAM, the standard needs to be satisfied at each of 32 mega cycles (more precisely 33,554,432 cycles) equivalent to the number of memory cells corresponding to the respective terminals.

It is necessary to examine whether a manufactured device meets this standard or not. In a case of a DDR SDRAM, however, a relative time difference between a strobe signal DQS output and a data signal DQ output should be verified. The strobe signal DQS providing a reference time for the verification has a jitter component with respect to a clock signal applied to the DDR SDRAM. Therefore, the strobe signal DQS is not always output at fixed timing for a clock signal. Tester accordingly needs to simultaneously measure a time of a rise or a fall of the strobe signal DQS and a time when the data signal DQ changes and obtain a difference between the two times to examine the tDQSQ standard.

However, as described with reference to FIG. 14, in a conventional tester, it is a common practice to set a determination reference time according to a timing generator 126 to examine whether the data signal DQ is desired data, that is, a "H" level or a "L" level is output, from the memory device at the determination reference time. The tester then indicates the result as PASS/FAIL. Thus structured tester has a difficulty in measuring a data signal change point, with such a signal having a jitter component changing every cycle as the strobe signal DQS described in the foregoing as an origin.

Speed and data rate of semiconductor memory devices have been increased year by year. In recent years, higher and higher precision is required of a standard for timing between a strobe signal and data for the purpose of transferring data at a high speed. For example, while demanded precision has been conventionally on the order of nanosecond (ns), recent DDR SDRAM is required to have a precision on the order of picoseconds (ps). In the above-described tDQSQ standard, a precision within 750 ps, for example, is demanded. Under these circumstances, semiconductor manufacturers need to ensure the standard by stringent examination taking a test margin into consideration.

In other words, for an ordinary tester to measure the tDQSQ standard of DDR SDRAMs, the tester should have an extremely high level of performance. As long as a device is defined by the standard, it is necessary to observe whether the device has performance meeting the standard or not.

SUMMARY OF THE INVENTION

An object of the present invention is to provide a semiconductor memory device capable of executing a performance test related to a timing standard for a data signal and a strobe signal with ease and a method of testing a semiconductor memory device.

In summary, the present invention relates to a semiconductor memory device having a storage unit and a test circuit. The storage unit includes a plurality of memory cells and successively outputs data held in the plurality of memory cells and outputs a strobe signal whose signal waveform has a leading edge and a trailing edge synchronizing with the data output successively. The test circuit accepts data in response to the strobe signal.

The test circuit includes a first transmission gate unit responsive to a strobe signal to become conductive to transmit data and a first holding unit for holding data transmitted by the first transmission gate unit.

According to another aspect, the present invention relates to a subsidiary device for connecting, to a testing device, a semiconductor memory device which includes a plurality of memory cells and successively outputs data held in the plurality of memory cells and outputs a strobe signal whose signal waveform has a leading edge and a trailing edge synchronizing with data output successively, which subsidiary device includes first, second and third terminals and a test circuit.

The first and the second terminals receive data and a strobe signal from the semiconductor memory device, respectively.

The test circuit accepts data applied through the first terminal in response to the strobe signal applied through the second terminal. The test circuit includes a first transmission gate unit responsive to the strobe signal to become conductive to transmit data and a first holding unit for holding data transmitted by the first transmission gate unit. The third terminal transmits the output of the first holding unit to the testing device.

According to a further aspect of the present invention, the present invention relates to a testing device for testing a semiconductor memory device which includes a plurality of memory cells and successively outputs data held in the plurality of memory cells and outputs a strobe signal whose signal waveform has a leading edge and a trailing edge synchronizing with data output successively, which testing device includes a timing generator, a signal generator, a test circuit and a determination unit.

The timing generator outputs a timing reference for a test. The signal generator outputs a control signal to be applied to the semiconductor memory device and data to be stored therein in response to the output of the timing generator.

The test circuit accepts data in response to the strobe signal. The test circuit includes a first transmission gate unit responsive to the strobe signal to become conductive to transmit data and a first holding unit for holding data transmitted by the first transmission gate unit. The determination unit determines whether the output of the first holding unit coincides with an expected value.

Accordingly, a main advantage of the present invention is to facilitate verification by a testing device that a strobe signal and data have a predetermined relative time relation by latching data at a test circuit in practice.

The foregoing and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
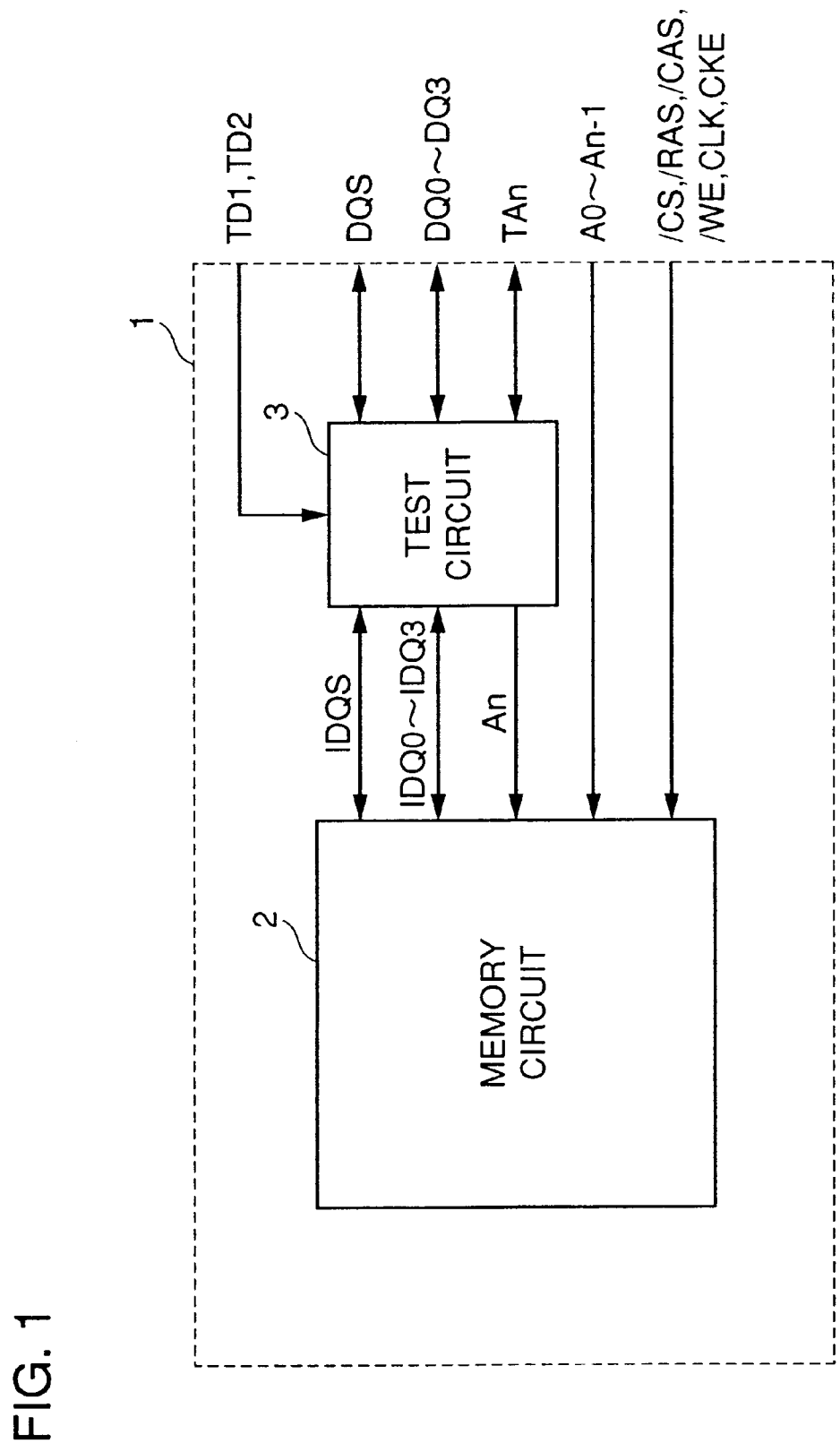
FIG. 1 is a schematic block diagram for use in explaining a structure of a semiconductor memory device 1 according to a first embodiment of the present invention.

In the following, embodiments of the present invention will be described in detail with reference to the drawings. Like numerals in the drawings represent the same or corresponding parts.

[First Embodiment]

FIG. 1 is a schematic block diagram for use in explaining a structure of a semiconductor memory device 1 according to a first embodiment of the presents invention.

With reference to FIG. 1, the semiconductor memory device 1 includes a memory circuit 2 which conducts storage operation as a semiconductor memory device and a test circuit 3 for facilitating a test. The test circuit 3 receives external control signals TD1 and TD2, sends and receives a strobe signal DQS, data signals DQ0 to DQ3 and an address signal TAn to and from external sources and sends and receives a strobe signal IDQS and data signals IDQ0 to IDQ3 to and from the memory circuit 2. In addition, the test circuit 3 applies an address signal An to the memory circuit 2. The memory circuit 2 receives internal address signals A0 to An–1, control signals /CS, /RAS, /CAS and /WE, a clock signal CLK and a clock enable signal CKE.

Figure 2:
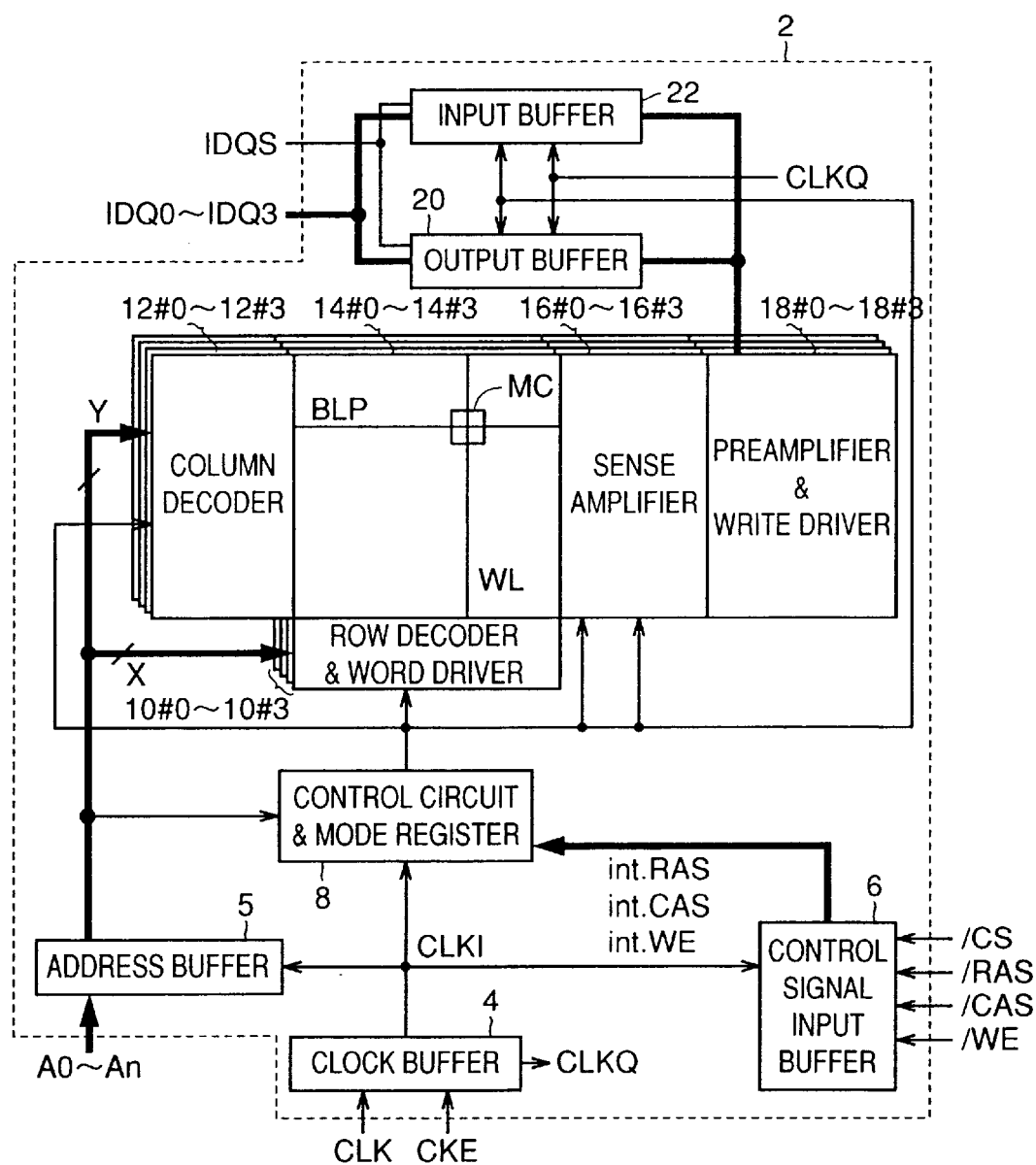
FIG. 2 is a schematic block diagram showing a structure of a memory circuit 2 illustrated in FIG. 1.

FIG. 2 is a schematic block diagram showing the structure of the memory circuit 2 illustrated in FIG. 1.

With reference to FIG. 2, the memory circuit 2 includes memory array banks 14#0 to 14#3 each having a plurality of memory cells arrayed in matrix, an address buffer 5 for accepting the address signals A0 to An in synchronization with a clock signal CLKI and outputting an internal row address X and an internal column address Y, a clock buffer 4 for receiving the external clock signal CLK and clock enable signal CKE to output clock signals CLKI and CKLQ for use in the memory circuit 2, and a control signal input buffer 6 for accepting the control signals /CS, /RAS, /CAS and /WE in synchronization with the clock signal CLKI.

Each of the memory array banks 14#0 to 14#3 includes memory cells MC arranged in a matrix, a plurality of word lines WL provided corresponding to the rows of the memory cells MC and a plurality of bit line pairs BLP provided corresponding to the columns of the memory cells MC. In FIG. 2, each one of the memory cells MC, the word lines WL and the bit line pairs BLP are illustrated as a representative.

The memory circuit 2 further includes a control circuit for receiving an internal address signal from the address buffer 5 and receiving control signals int.RAS, int.CAS and int.WE synchronized with a clock signal from the control signal input buffer 6 to output a control signal to each block in synchronization with the clock signal CKLI, and a mode register for holding an operation mode recognized by the control circuit. In FIG. 2, the control circuit and the mode register are illustrated as one block denoted as block 8.

The control circuit includes a bank decoder for designating a bank based on an address signal and a command decoder for conducting decoding in response to the control signals int.RAS, int.CAS and int.WE.

The memory circuit 2 further includes row decoders provided corresponding to the memory array banks 14#0 to 14#3 for decoding the row address signal x applied from the address buffer 5, and word drivers for driving a row (word line) in the memory array banks 14#0 to 14#3 whose address is designated to enter a selected state in response to an output signal of the row decoder. In FIG. 2, each one of row decoders and one of word drivers are paired and illustrated as one of the blocks denoted as blocks 10#0 to 10#3.

The memory circuit 2 further includes column decoders 12#0 to 12#3 for decoding the internal column address signal Y applied from the address buffer 5 to generate a column selecting signal, and sense amplifiers 16#0 to 16#3 for sensing and amplifying data of the memory cells connected to a selected row of the memory array banks 14#0 to 14#3.

The memory circuit 2 further includes an input buffer 22 for receiving external write data to generate internal write data, a write driver for amplifying internal write data from the input buffer 22 to transmit the amplified data to a selected memory cell, a preamplifier for amplifying data read from a selected memory cell, and an output buffer 20 for conducting buffering processing with respect to data from the preamplifier and externally outputting the processed data.

The preamplifiers and write drivers are provided corresponding to the memory array banks 14#0 to 14#3. In FIG. 2, one of the preamplifiers and the write drivers are paired and illustrated as one of the blocks denoted as blocks 18#0 to 18#3.

The input buffer 22 accepts data DQ0 to DQ15 externally applied through the terminal in response to strobe signal STRB1 and STRB2 complementary to each other. The strobe signals STRB1 and STRB2 are signals as a reference for a data acceptance time which are output in synchronization with data by other semiconductor device or the like to the memory circuit 2. The memory circuit 2 receives the strobe signals STRB1 and STRB2 which are transmitted from the external source in parallel to the data and applied to the two terminals, respectively, and takes the signals as a data signal acceptance reference.

The output buffer 20 outputs the data DQ0 to DQ15 in synchronization with the clock signal CLKQ when the memory circuit 2 externally outputs data, as well as externally outputting the strobe signals STRB1 and STRB2 for use in acceptance of the data signals by other semiconductor device.

Figure 3:
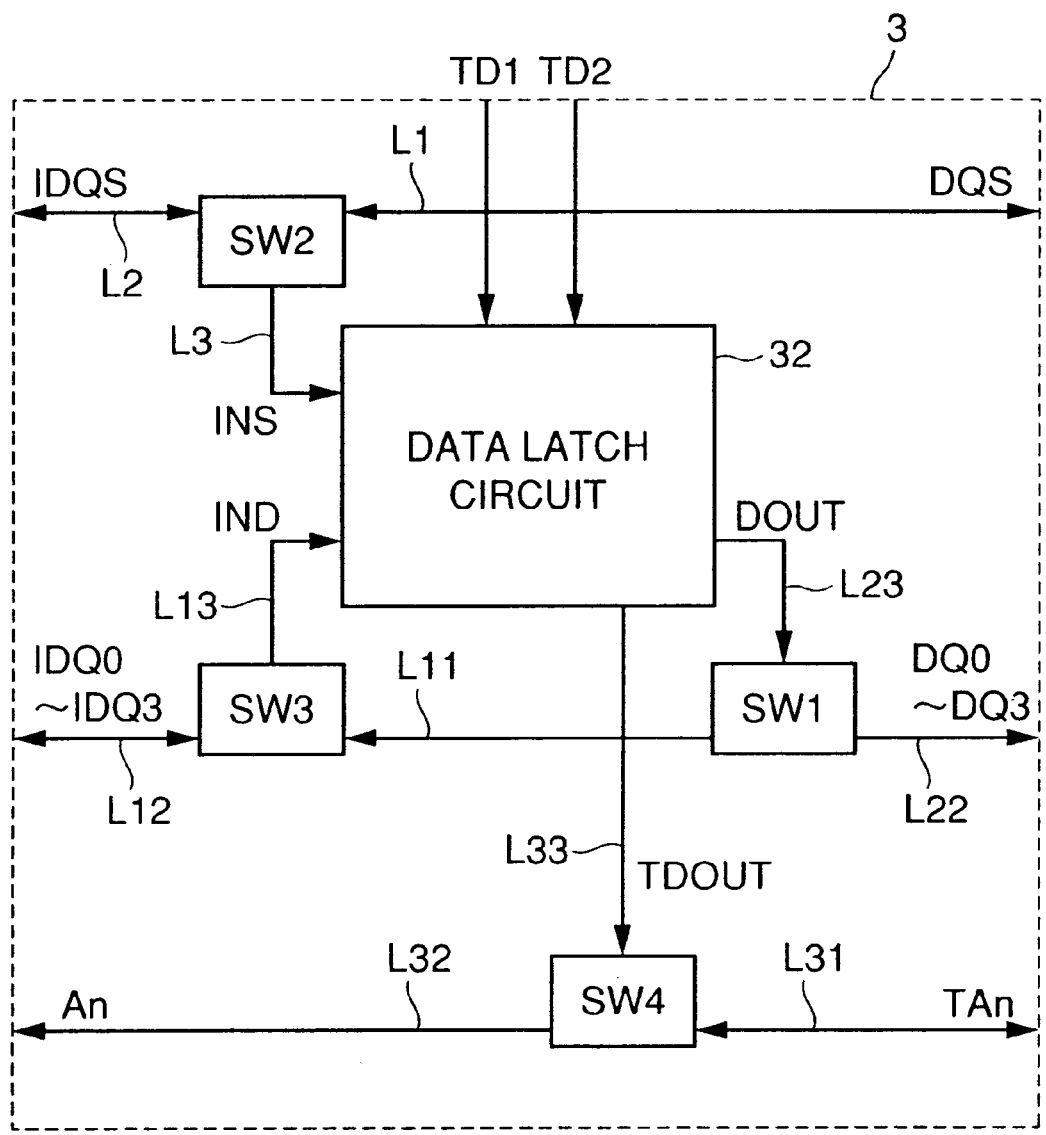
FIG. 3 is a block diagram for use in explaining a structure of a test circuit 3 in FIG. 1.

FIG. 3 is a block diagram for use in explaining the structure of the test circuit 3 illustrated in FIG. 1.

With reference to FIG. 3, the test circuit 3 includes a data latch circuit 32 for latching data at the time of a test and switch circuits SW1 to SW4.

The data latch circuit 32 accepts a data signal IND in response to a strobe signal INS, latches the result and outputs the same as an output signal DOUT. In addition, the data latch circuit 32 receives input of control signals TD1 and TD2 for controlling a delay time amount of the strobe signal and the data signal which will be described later and outputs a degenerated determination result signal TDOUT for use in examining the data latch circuit.

The switch circuit SW2 is connected to three signal lines which transmit the strobe signals IDQS, DQS and INS, respectively. The switch circuit SW3 is connected to a signal line L12 on which the data signals IDQ0 to IDQ3 are transmitted, a signal line L13 on which the data signal IND is transmitted and a signal line L11. The switch circuit SW1 is connected to the signal line L11, a signal line L23 for transmitting the data output signal DOUT and a signal line L22 for transmitting the data signals DQ0 to DQ3. The switch circuit SW4 is connected to a signal line L33 on which the determination result signal TDOUT is transmitted, a signal line L31 on which the address signal TAn is transmitted and a signal line L32 on which the address signal An is transmitted.

Figure 4:
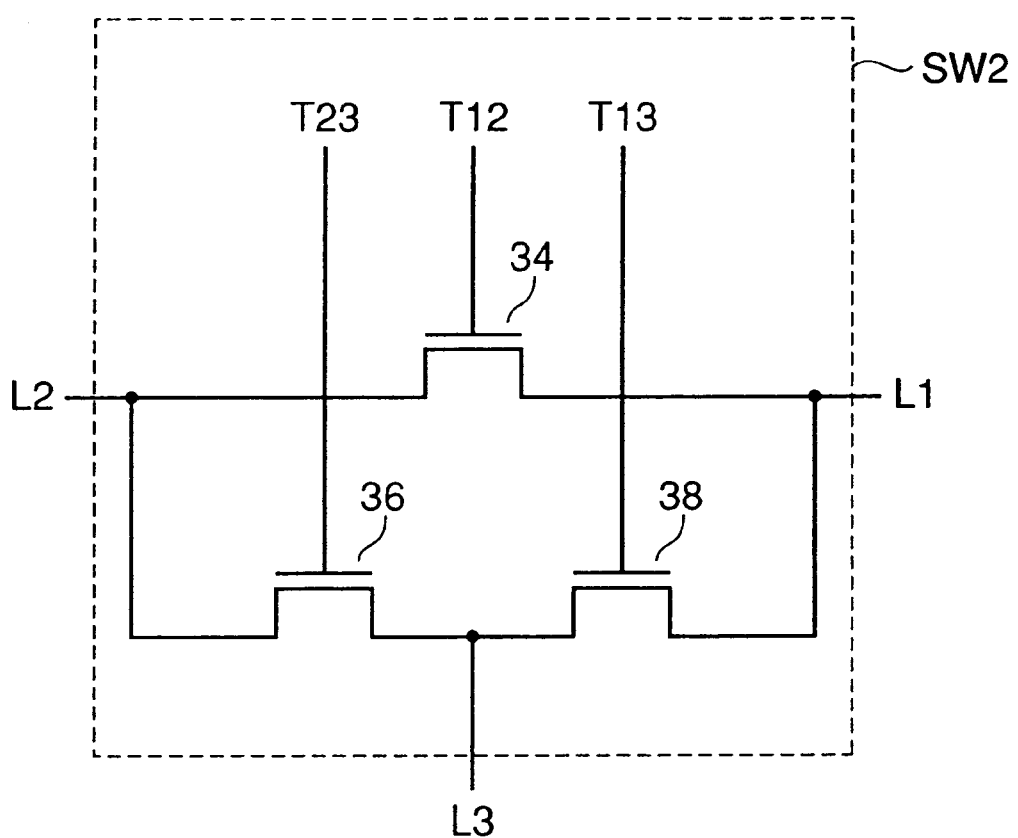
FIG. 4 is a circuit diagram showing a structure of a switch circuit SW2 in FIG. 3.

FIG. 4 is a circuit diagram showing the structure of the switch circuit SW2 in FIG. 3.

With reference to FIG. 4, the switch circuit SW2 includes a MOS transistor 34 connected between a signal line LI and a signal line L2 and having a gate which receives a signal T12, a MOS transistor 36 connected between the signal line L2 and a signal line L3 and having a gate which receives a signal T23, and a MOS transistor 38 connected between the signal line L1 and the signal line L3 and having a gate which receives a signal T13.

Although FIG. 4 illustrates an example of a switch circuit composed of three MOS transistors, the circuit may have other structure as long as it enables two of the signal lines L1, L2 and L3 to be selectively connected.

In addition, since the switch circuits SW1, SW3 and SW4 shown in FIG. 3 have the same structure as that of the switch circuit SW2 illustrated in FIG. 4 or have a structure in which a plurality of bits of the switch circuits SW2 are provided in parallel, description thereof will not be repeated.

Figure 5:
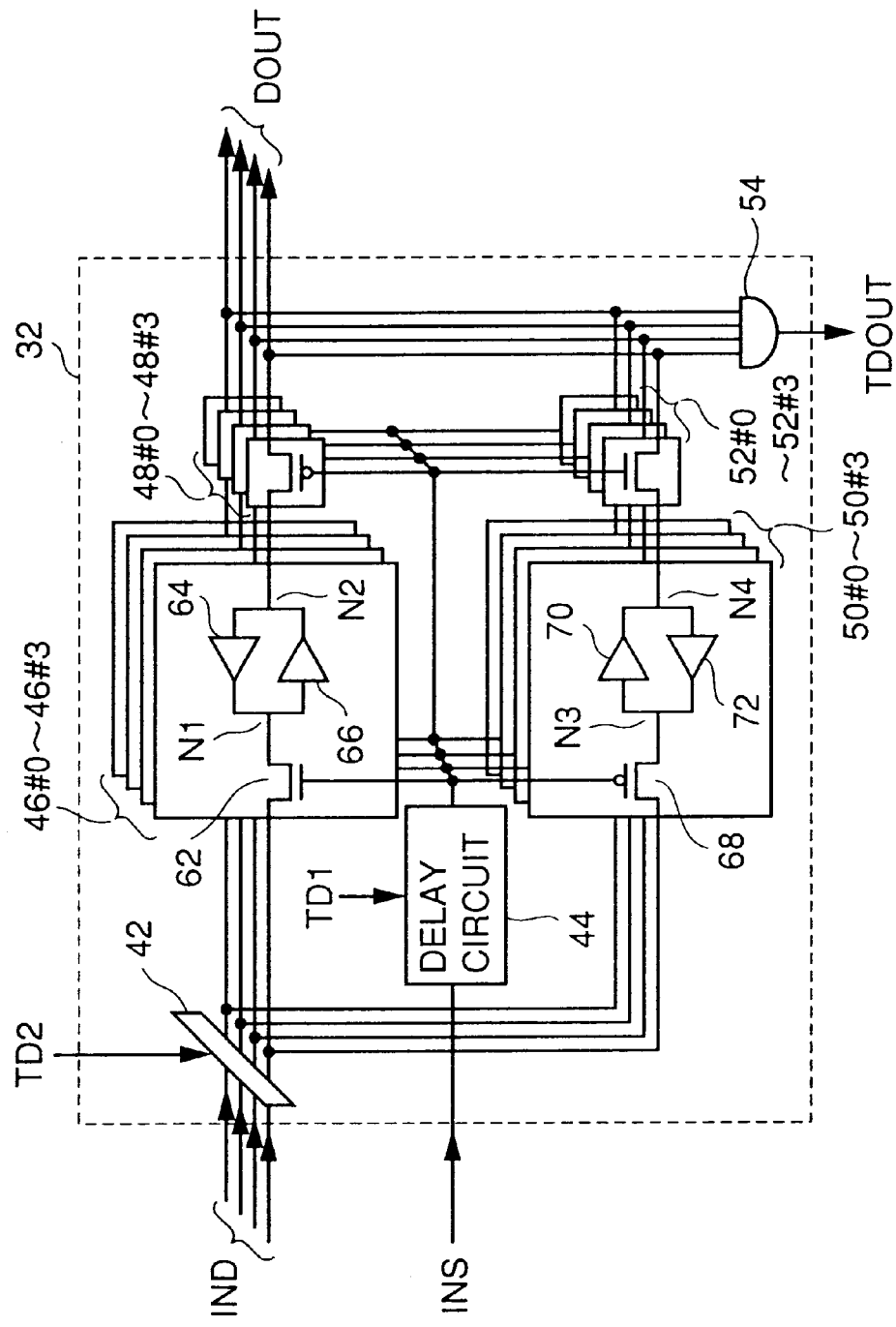
FIG. 5 is a circuit diagram showing a structure of a data latch circuit 32 in FIG. 3.

FIG. 5 is a circuit diagram showing the structure of the data latch circuit 32 in FIG. 3.

With reference to FIG. 5, the data latch circuit 32 includes a delay circuit 42 whose delay amount is set by the control signal TD2 and which delays the data signal IND and outputs the delayed signal, and a delay circuit 44 whose delay amount is set by the control signal TD1 and which delays the strobe signal INS and outputs the delayed signal.

The data latch circuit 32 further includes latch circuits 46#0 to 46#3 for internally latching the output of the delay circuit 42 in response to the output of the delay circuit 44 and transmission gates 48#0 to 48#3 for outputting the outputs of the latch circuits 46#0 to 46#3 as the data output signal DOUT in response to the output of the delay circuit 44.

The data latch circuit 32 further includes latch circuits 50#0 to 50#3 for latching the output of the delay circuit 42 in response to the output of the delay circuit 44, transmission gates 52#0 to 52#3 for outputting the outputs of the latch circuits 50#0 to 50#3 as the data output signal DOUT in response to the output of the delay circuit 44, and a gate circuit 54 for regenerating four bits included in the data output signal DOUT and outputting the regenerated signal as the determination result signal TDOUT.

The transmission gates 48#0 to 48#3 are composed of P channel MOS transistors which become conductive when the output of the delay circuit 44 is at a "L" level. The transmission gates 52#0 to 52#3 are composed of N channel MOS transistors which become conductive when the output of the delay circuit 44 is at a "H" level.

The latch circuit 46#0 includes an N channel MOS transistor 62 which becomes conductive in response to the output of the delay circuit 44 to transmit the output of the delay circuit 42 to a node N1, a buffer circuit 66 having an input connected to the node N1 and an output connected to a node N2, and a buffer circuit 64 having an input connected to the node N2 and an output connected to the node N1. The latch circuits 46#1 to 46#3 have the same structure as that of the latch circuit 46#0 and description thereof will not be repeated.

The latch circuit 50#0 includes a transmission gate 68 which becomes conductive in response to the output of the delay circuit 44 to transmit the output of the delay circuit 42 to a node N3, a buffer circuit 70 having an input connected to the node N3 and an output connected to a node N4, and a buffer circuit 72 having an input connected to the node N4 and an output connected to the node N3. The latch circuits 50#1 to 50#3 have the same structure as that of the latch circuit 50#0 and description thereof will not be repeated.

In the data latch circuit 32, output from the node N2 is the output signal of the latch circuit 46#0. The output signal of the latch circuit 50#0 is output from the node N4.

The data latch circuit 32 is an example of a circuit adapted to a DDR SDRAM having a 4-bit output, and other components than the delay circuit 44 and the gate circuit 54 are provided four each corresponding to the output bits of the DDR SDRAM. The latch circuits 46 and 50 and the transmission gates 48 and 52 are provided as many as a number n each when the DDR SDAM has an n-bit output.

Figure 6:
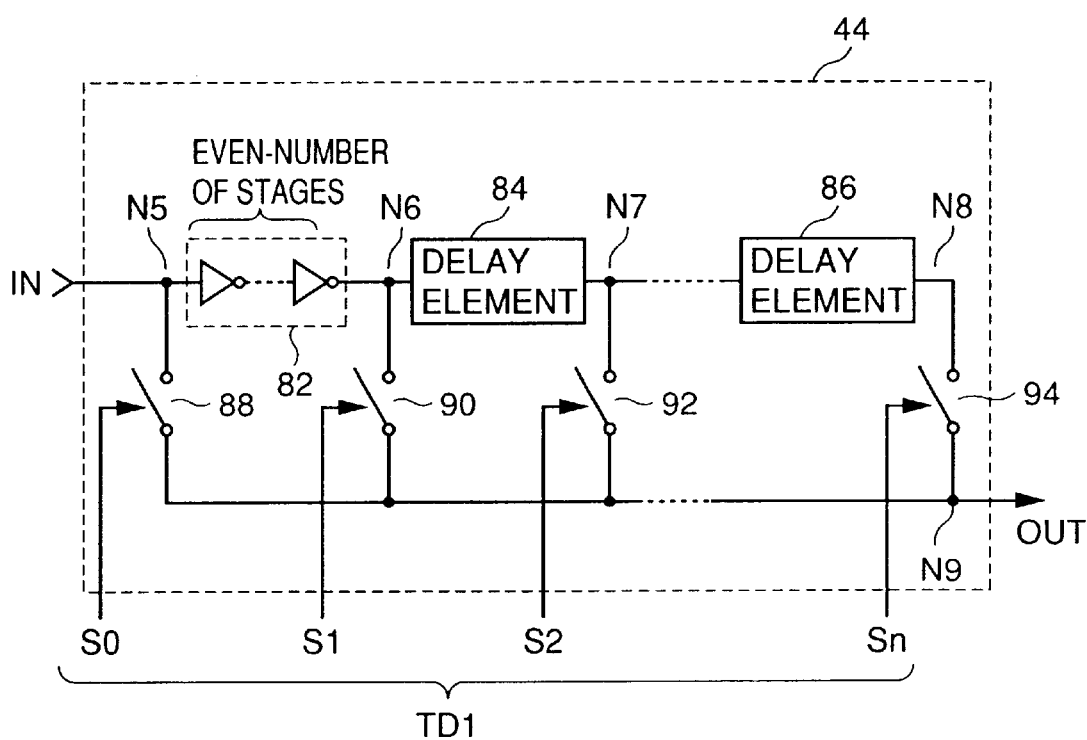
FIG. 6 is a circuit diagram for use in explaining a structure of a delay circuit 44 illustrated in FIG. 5.

FIG. 6 is a circuit diagram for use in explaining the structure of the delay circuit 44 illustrated in FIG. 5.

With reference to FIG. 6, the delay circuit 44 includes delay elements 82 to 86 connected in series for receiving an input signal IN applied to a node N5, a switch 88 connected between the node N5 and a node N9 from which an output signal OUT is output and responsive to a control signal S0 to become conductive, a switch 90 connected between a node N6 to which the output of the delay element 82 is applied and the node N9 and responsive to a control signal S1 to become conductive, a switch 92 connected between a node N7 to which the output of the delay element 84 is applied and the node N9 and responsive to a control signal S2 to become conductive, and a switch 94 connected between a node N8 to which the output of the delay element 86 is applied and the node N9 and responsive to a control signal Sn to become conductive.

Each of the delay elements 82 to 86 includes an even-number of stages of inverters connected in series. The control signals S0 to Sn are control signals included in the control signal TD1.

Figure 7:
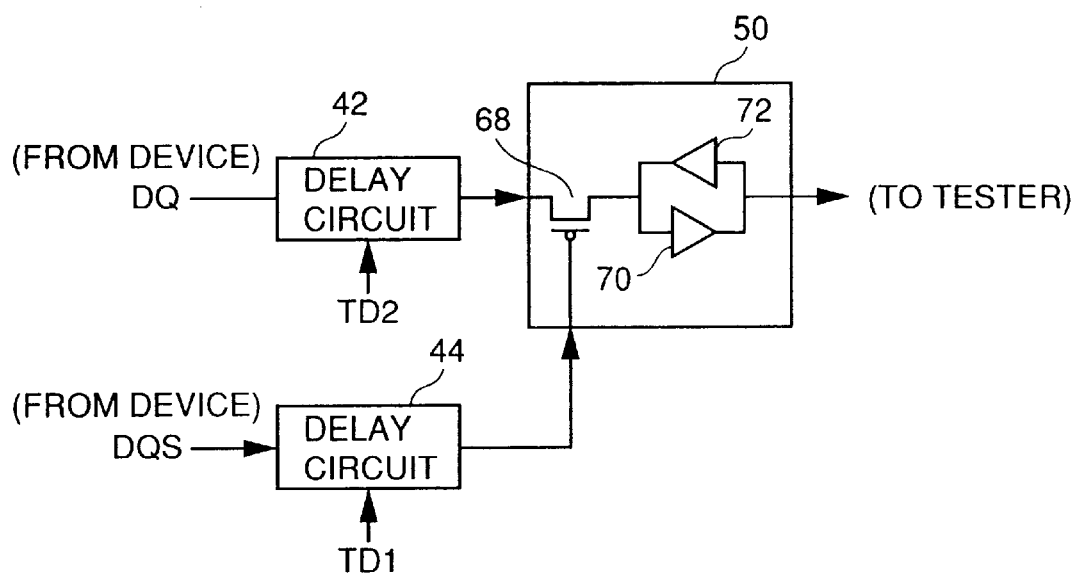
FIG. 7 is a diagram for use in explaining basic operation of the data latch circuit 32.

FIG. 7 is a diagram for use in explaining basic operation of the data latch circuit 32.

Figure 8:
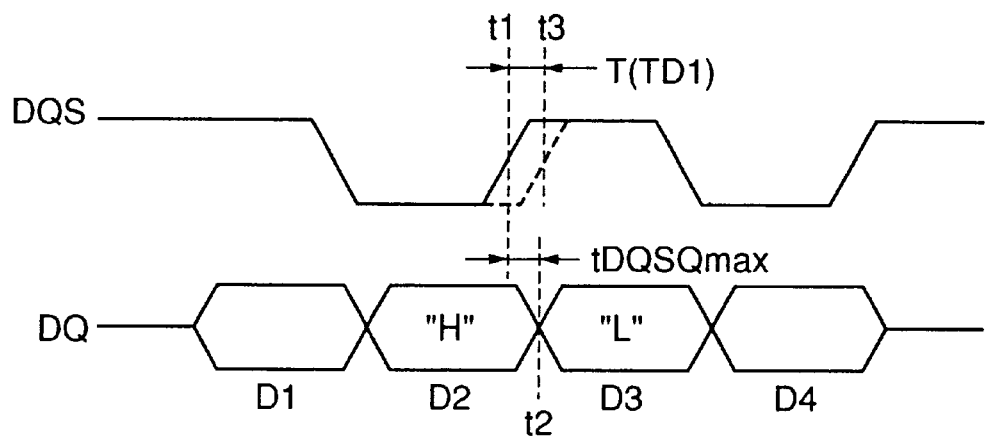
FIG. 8 is a waveform diagram for use in explaining operation conducted when output of a data signal DQ delays behind a strobe signal DQS.

FIG. 8 is a waveform diagram for use in explaining a test for verifying a tDQSQmax among tDQSQ standards.

With reference to FIGS. 7 and 8, from the DDR SDRAM, data D1 to D4 is successively output and the strobe signal DQS in synchronization with the data is output.

Description will be made of a case where at time t1, the strobe signal DQS rises from a "L" level to a "H" level and later at time t2, the data D3 synchronized with the rise of the strobe signal is output.

FIG. 8 shows a case where a switching point where a transition is made from the data D2 to the data D3 falls on a limiting point of tDQSQmax. Therefore, for satisfying the tDQSQmax, a switching point where the transition from the data D2 to the data D3 is made should exist between the time t1 when the leading edge of the strobe signal DQS is input and the time t2 after a lapse of the time tDQSQmax from the time t1. In other words, when "H" is output as the data D2 and "L" is output as the data D3, the tDQSQmax standard is satisfied if the data signal DQ is at a "H" level at the time t1 and the data signal DQ is at a "L" level at the time t2. Conversely, if at the time t2, the data signal DQ is at a "H" level, the device fails to satisfy the standard for the time tDQSQmax. Accordingly, with the delay circuit 42 having no delay, setting the delay circuit 44 to have a delay of tDQSQmax by the control signal TD1 which designates a delay amount results in rendering the transmission gate 68 non-conductive at the time t3, so that data of the latch circuit 50 is defined and output to the tester. The output to the tester is in practice selectively applied to the tester when the output of the delay circuit 44 is at a "H" level because of the transmission gate 52 provided at the output part of the latch circuit 50 in FIG. 5.

As a result, with the strobe signal DQS delayed by tDQSQmax, making the latch circuit 50 to hold data to enable the tester to determine whether the latch circuit holds the expected "L" of the data D3 or whether the latch circuit 50 holds "H" as the contents of the data D2 when the standard is not satisfied leads to determination whether the standard for tDQSQmax is satisfied or not.

In the foregoing description, timing is all defined at a point where the amplitude is 50%.

Next, description will be made of tDQSQmin among the tDQSQ standards.

Figure 9:
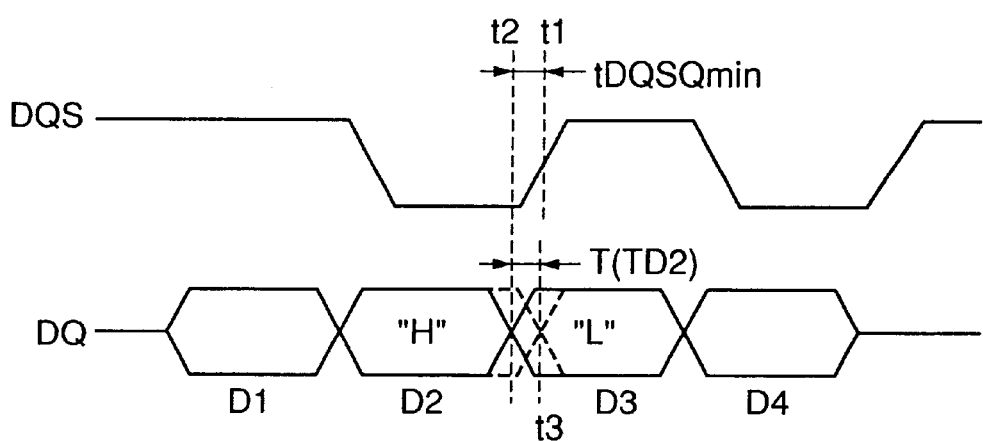
FIG. 9 is a waveform diagram for use in explaining a test for determining whether a device meets a tDQSQmin standard.

FIG. 9 is a waveform diagram for use in explaining a test for determining whether a standard for tDQSQmin is satisfied or not.

With reference to FIGS. 7 and 9, consideration will be given to a case where the data signal DQ is output before the strobe signal DQS as indicated by a solid line. The figure illustrates a case where a transition point from the data D2 to the data D3 falls on the position limit satisfying tDQSQmin.

In other words, assuming a time earlier by the time of tDQSQmin than the time t1 when the strobe signal DQS rises to be t2, for satisfying the standard for tDQSQmin, the transition point from the data D2 to the data D3 should exist between the time t2 and t1.

In a case, for example, where "H" is output as the data D2 and "L" is output as the data D3, the device is considered to satisfy the standard for tDQSQmin when the data signal DQ is at a "L" level at the time t1 and the data signal DQ is at a "H" level at the time t2. Conversely, when at the time t2 the data signal DQ is already at a "L" level, the device fails to meet the standard for the time tDQSQmin.

For verifying the foregoing, for example, data held by the latch circuit 50 may be observed, with the delay amount of the delay circuit 44 of FIG. 7 set to zero and the data signal DQ delayed by the time tDQSQmin by the delay circuit 42. As a result, if it is determined that when the transmission gate 68 becomes non-conductive at a leading edge of the strobe signal DQS at the time t1 to define the data of the latch circuit 50, "H" as the contents of the data D2 is held, the standard for tDQSQmin is satisfied.

Although the foregoing description has been made of a case where "H" and "L" are output as the data D2 and D3, respectively, in order to realize this state, it is necessary to write data in the memory array in advance to conduct reading control such that "H" is output as an expected value of the data D2 and "L" is output as an expected value of the data D3.

In addition, although the verification test has been described for the determination by the latch circuit whether the tDQSQ standard is satisfied or not, in a case where a test circuit including the latch circuit in question is provided in the semiconductor memory device, performance verification of the latch circuit part should be conducted in advance.

Figure 10:
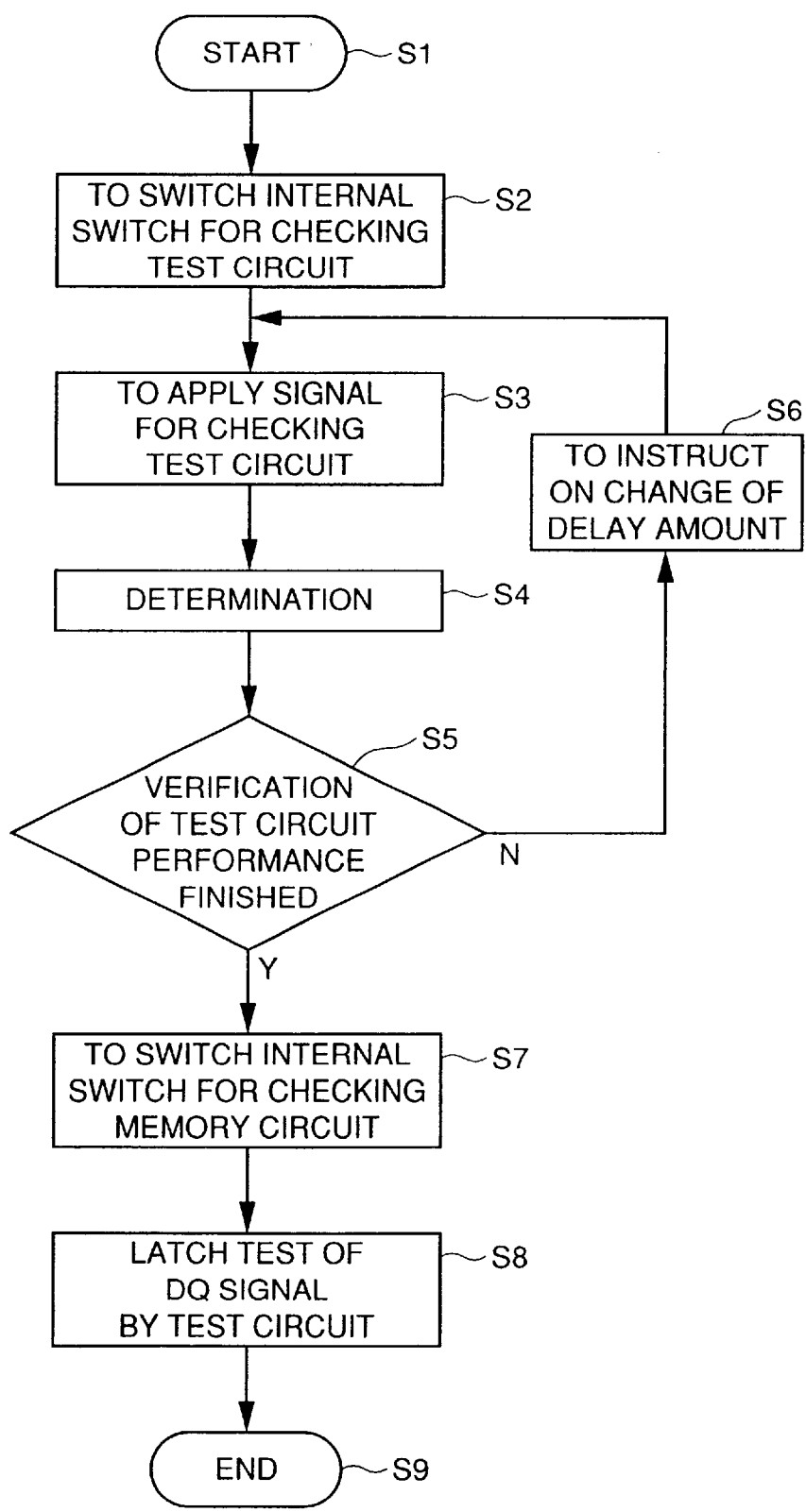
FIG. 10 is a flow chart for use in explaining a performance verification test of a test circuit.

FIG. 10 is a flow chart for use in explaining a performance verification test of the test circuit.

With reference to FIGS. 3 and 10, the test is started as Step S1. At Step S2, an internal switch is switched for checking the test circuit. More specifically, in the switch circuit SW2, the signal line L1 and the signal line L3 are connected and the signal line L2 is disconnected. In the switch circuit SW1, the signal line L11 and the signal L22 are connected and the signal line L23 is disconnected. In the switch circuit SW3, the signal line L11 and the signal line L13 are connected and the signal line L12 is disconnected. In the switch circuit SW4, the signal line L33 and the signal line L31 are connected and the signal line L32 is disconnected. Then, the control signals TD1 and TD2 are set at an initial value.

Subsequently, at Step S3, a signal is applied for checking the test circuit. More specifically, the strobe signal DQS applied from the tester is supplied to the data latch circuit 32 as a strobe signal INS. In addition, the data signals DQ0 to DQ3 applied from the tester are supplied to the data latch circuit as the data signal IND. Then, the data latch circuit 32 outputs the determination result signal TDOUT which will be output as the output signal TAn from one of address pins. Then, at Step S4, determination is made whether an expected value and the signal TAn coincide with each other or not by the tester to proceed to Step S5. At Step S5, if verification of the test circuit performance is yet to be finished, the routine proceeds to Step S6 where change of a delay amount is instructed by the control signals TD1 and TD2. Then, Steps S3, S4 and S5 will be repeated.

When at Step S5 the test circuit performance verification is finished, the routine proceeds to Step S7 to conduct switching of the internal switch for checking the memory circuit. More specifically, in the switch circuit SW2, the signal line L2 and the signal line L3 are connected. As a result, the strobe signal IDQS output from the memory circuit is applied to the data latch circuit 32 as the strobe signal INS. In the switch circuit SW3, the signal line L12 and the signal line L13 are connected and the signal line L11 is disconnected. As a result, the data signals IDQ0 to IDQ3 output from the memory circuit are applied to the data latch circuit 32 as the data signal IND.

In the switch circuit SW1, the signal line L23 and the signal line L22 are connected, so that the data output signal DOUT output from the data latch circuit is output to the tester as the data signals DQ0 to DQ3. In the switch circuit SW4, the signal line L32 and the signal line L31 are connected and the signal line L33 is disconnected. As a result, the address signal TAn applied from the tester is supplied to the memory circuit as the address signal An.

Subsequently at Step S8, the latch test of the DQ signal by the test circuit as described in FIGS. 8 and 9 is conducted. The device is considered to meet the tDQSQ standard when a right expected value is obtained by the latch test in either case of tDQSQmax and tDQSQmin. It is preferable to verify that the latch circuit holds an expected value properly when the delay circuit has no delay and then to conduct a test for tDQSQmax and tDQSQmin with corresponding delays applied.

Figure 11:
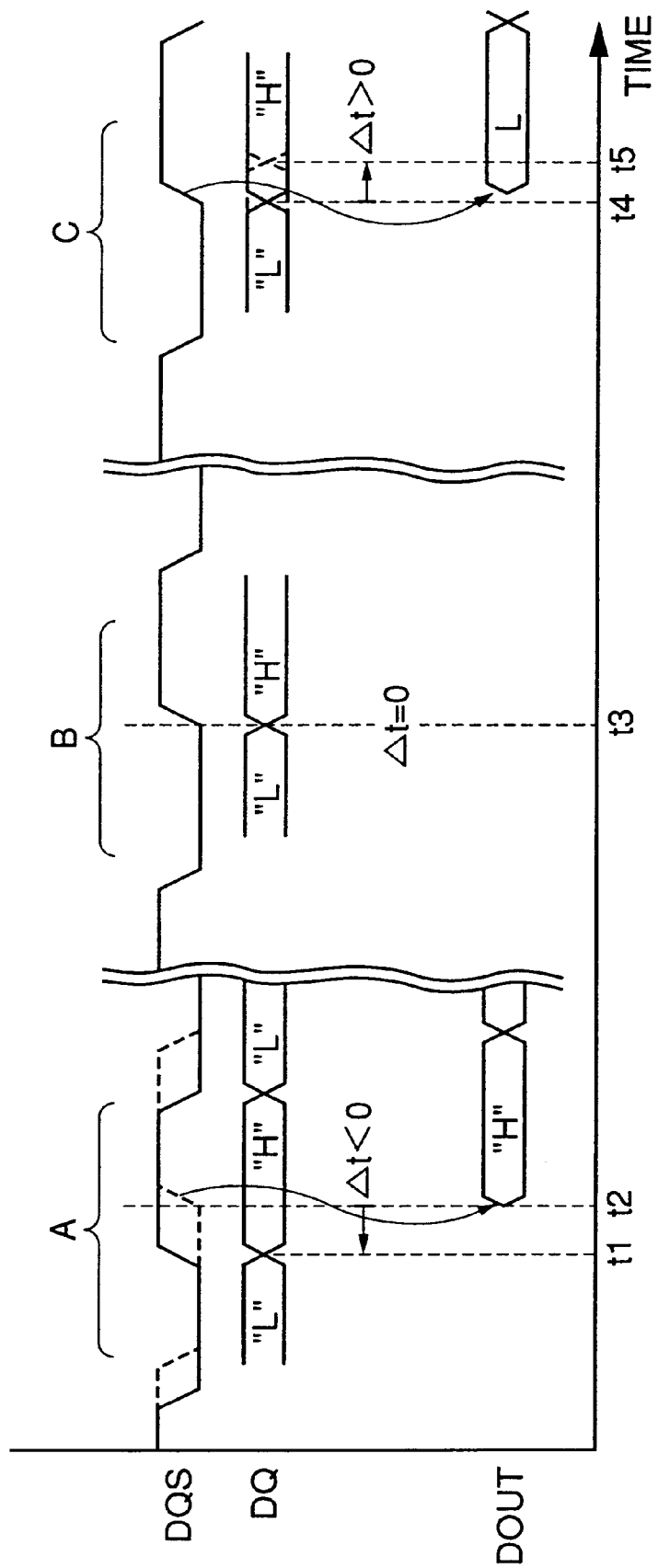
FIG. 11 is a waveform diagram for use in explaining operation at Steps S3 to S6 in FIG. 10.

FIG. 11 is a waveform diagram for use in explaining operation at Steps S3 to S6 of FIG. 10.

First, at the part A, delay the strobe signal DQS applied from the tester by the internal delay circuit from time t1 to the time t2. Then, at the time t2, in the latch circuit, the transmission gate 68 of FIG. 7 is closed to define the latch circuit, so that "H" is output as the output signal DOUT to the tester. Then, change the delay amount to provide a waveform which is obtained when both of the delay circuits of the strobe signal and the data signal applied to the latch circuit are set to have no delay as shown in the part B, and further change the delay amount to then control such that the data signal DQ is delayed behind the strobe signal by the delay circuit 42 as shown in the part C. Then, at time t4, the data signal DQ applied so as to change in synchronization with the strobe signal DQS will be applied to the latch circuit with its transition point changed from the time t4 to time t5. Then, at the latch circuit, data is defined in response to a rise of the strobe signal DQS at time t4 and "L" is output as the output signal DOUT of the data. Thus, normal operation of the test circuit is verified when after a gradual change of a data delay amount, the output signal DOUT is inverted before and after the state shown as the part B.

As described in the foregoing, provision of the test circuit in a semiconductor memory device which latches the data signal DQ with the strobe signal DQS of the memory device as a trigger and transmits the latched signal to the tester for determination enables examination whether the device satisfies the tDQSQ standard or not.

[Second Embodiment]

In the first embodiment, the semiconductor memory device is designed to contain a test circuit, the device may be designed differently.

Figure 12:
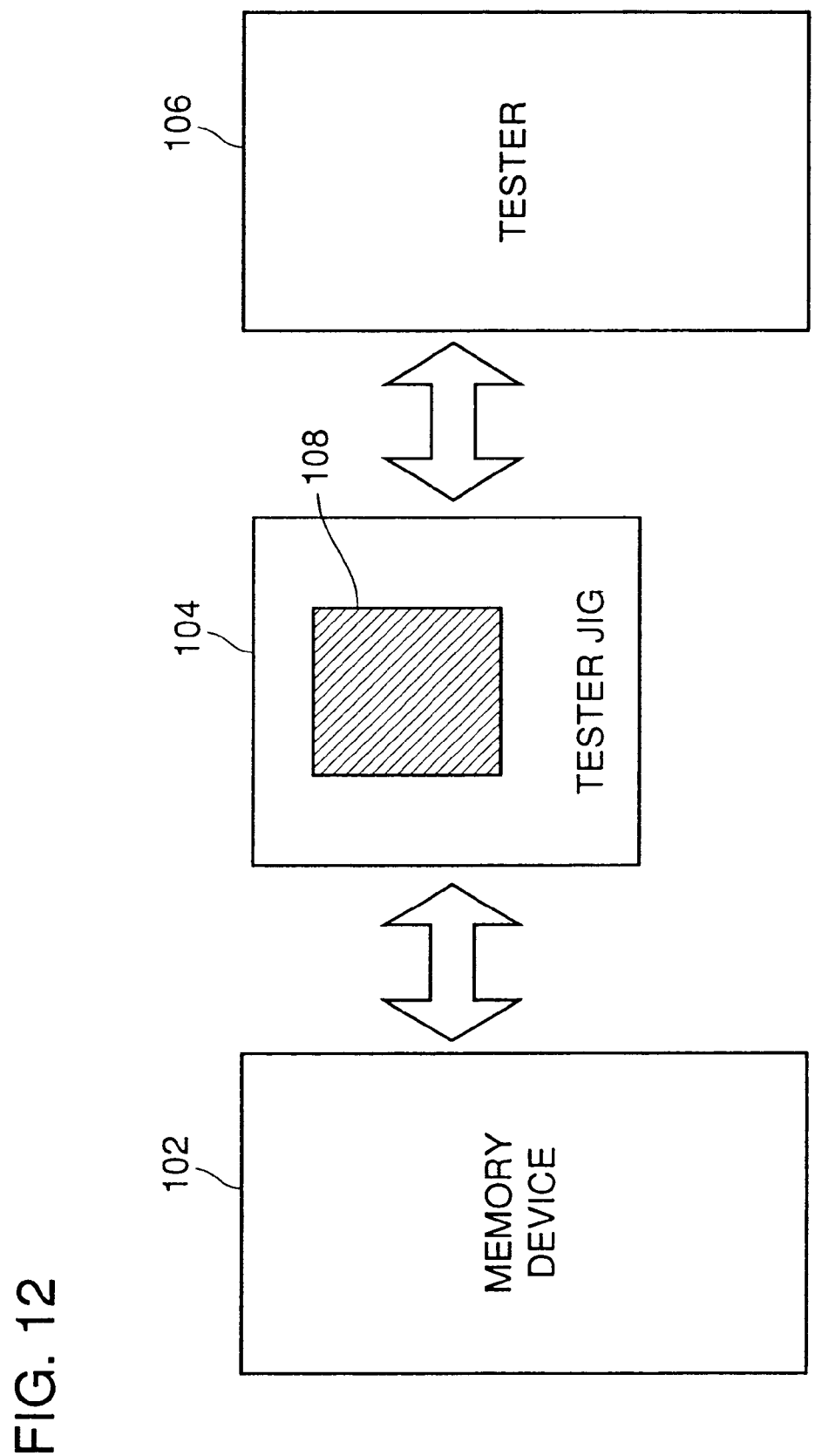
FIG. 12 is a conceptual diagram for use in explaining a connection between a memory device and a tester.

FIG. 12 is a conceptual diagram for use in explaining a connection between a memory device and a tester.

With reference to FIG. 12, a tester 106 and a memory device 102 are in general connected by a tester jig 104. The tester jig 104 is in many cases manufactured for each kind of semiconductor memory device. For example, since a semiconductor memory device varies in the number of pins and package configuration, socket and the like corresponding to its configuration are mounted on the tester jig. The tester jig may be mounted with such a test circuit 108 as described in the first embodiment.

Figure 13:
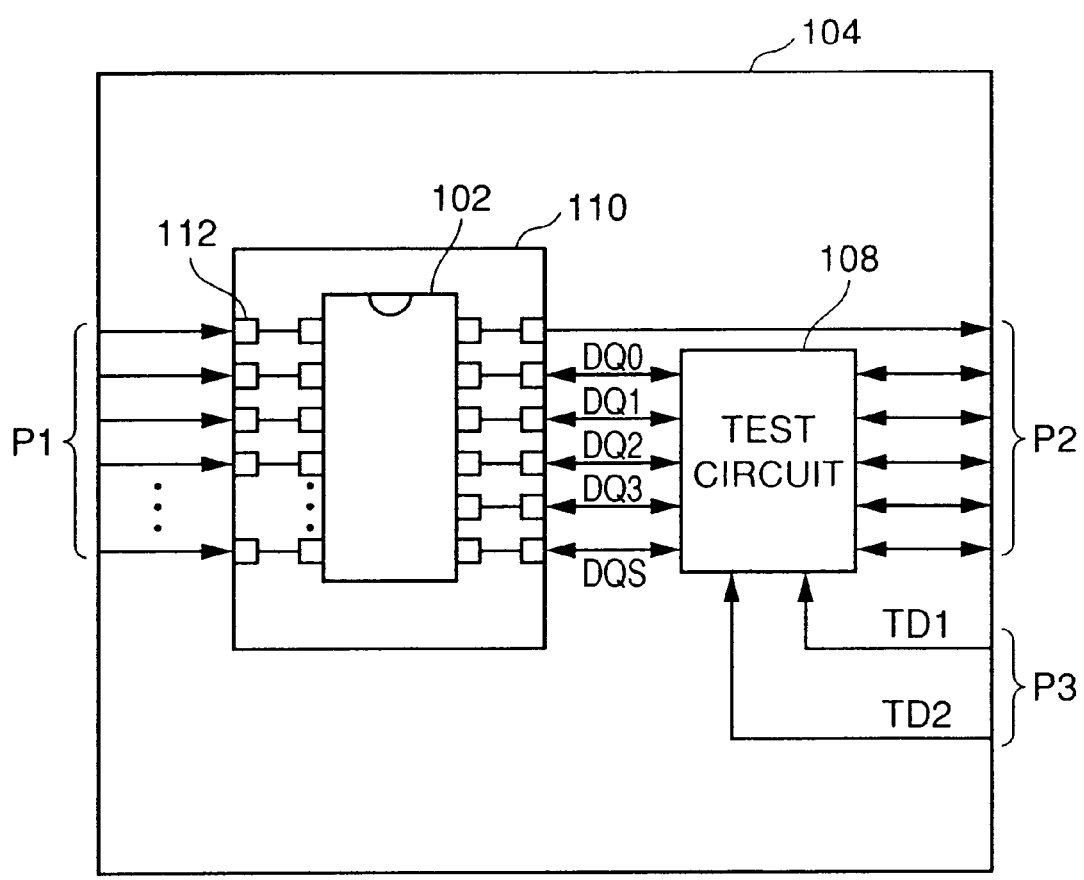
FIG. 13 is a diagram showing a structure of a tester jig 104.

FIG. 13 is a diagram showing the structure of the tester jig 104.

With reference to FIG. 13, the tester jig 104 includes a socket 110 and a test circuit 108 corresponding to the configuration of the memory device 102. The socket 110 is provided with connection terminals 112 corresponding to the terminals of the memory device 102. Between the socket 110 and the test circuit 108, data signals DQ0 to DQ3 and a strobe signal DQS are sent and received. The socket 110 is provided with a terminal group P1 to which control signals /RAS, /CAS and the like are applied, a terminal group P2 to which the data signals DQ0 to DQ3 and the strobe signal DQS are applied and a terminal group P3 to which control signals TD1 and TD2 for designating a delay amount of the test circuit 108 are applied. The structure of the test circuit 108 is the same as that of the test circuit 3 illustrated in FIG. 3 and description thereof will not be repeated. In a case where the test circuit is provided on the tester jig, since there is no need of examining the data latch circuit each time, no structure is necessary for outputting a determination result signal TDOUT indicative of an examination result of the data latch circuit as a part of an address signal.

As described in the foregoing, provision of the test circuit in the tester jig to enable the tester to determine a latching result of the test circuit results in attaining the same effect as that obtained by the first embodiment.

[Third Embodiment]

While the first embodiment shows a case where the test circuit is provided in the semiconductor memory device and the second embodiment shows a case where the test circuit is provided on the tester jig, the test circuit may be provided in other parts.

Figure 14:
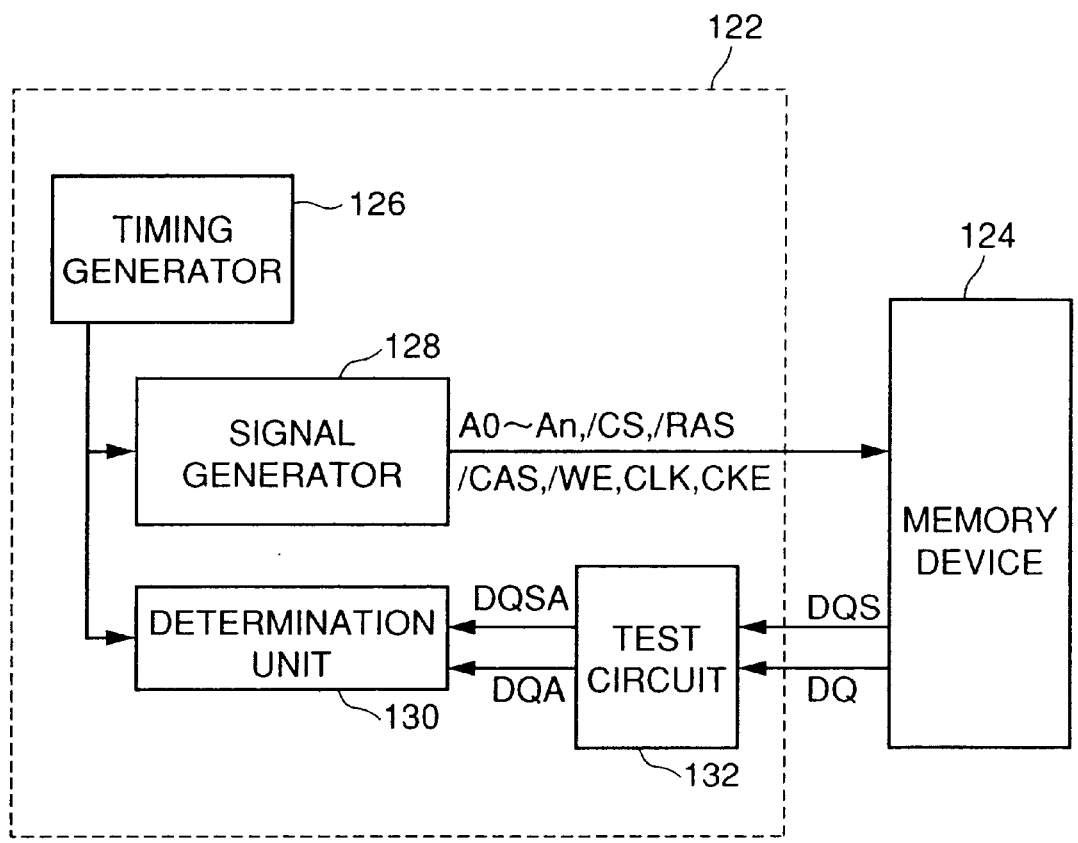
FIG. 14 is a block diagram for use in explaining a third embodiment of the present invention.
Figure 15:
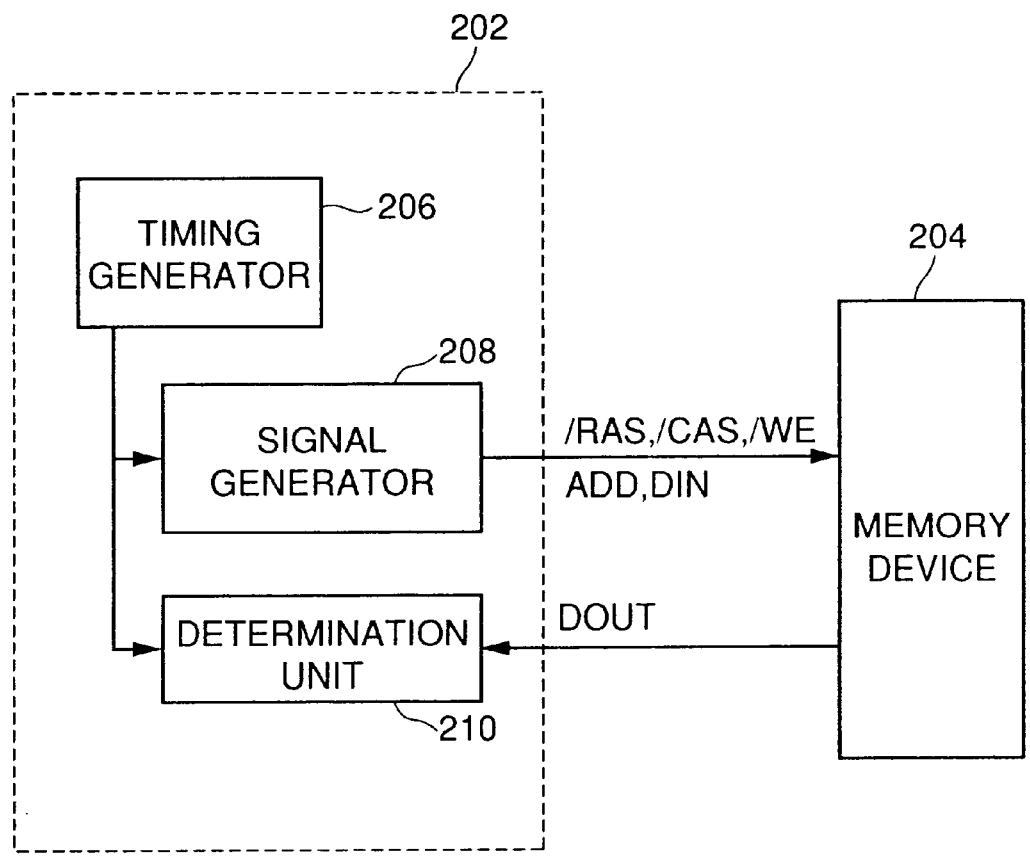
FIG. 15 is a diagram for use in explaining performance verification by a conventional tester.
Figure 16:
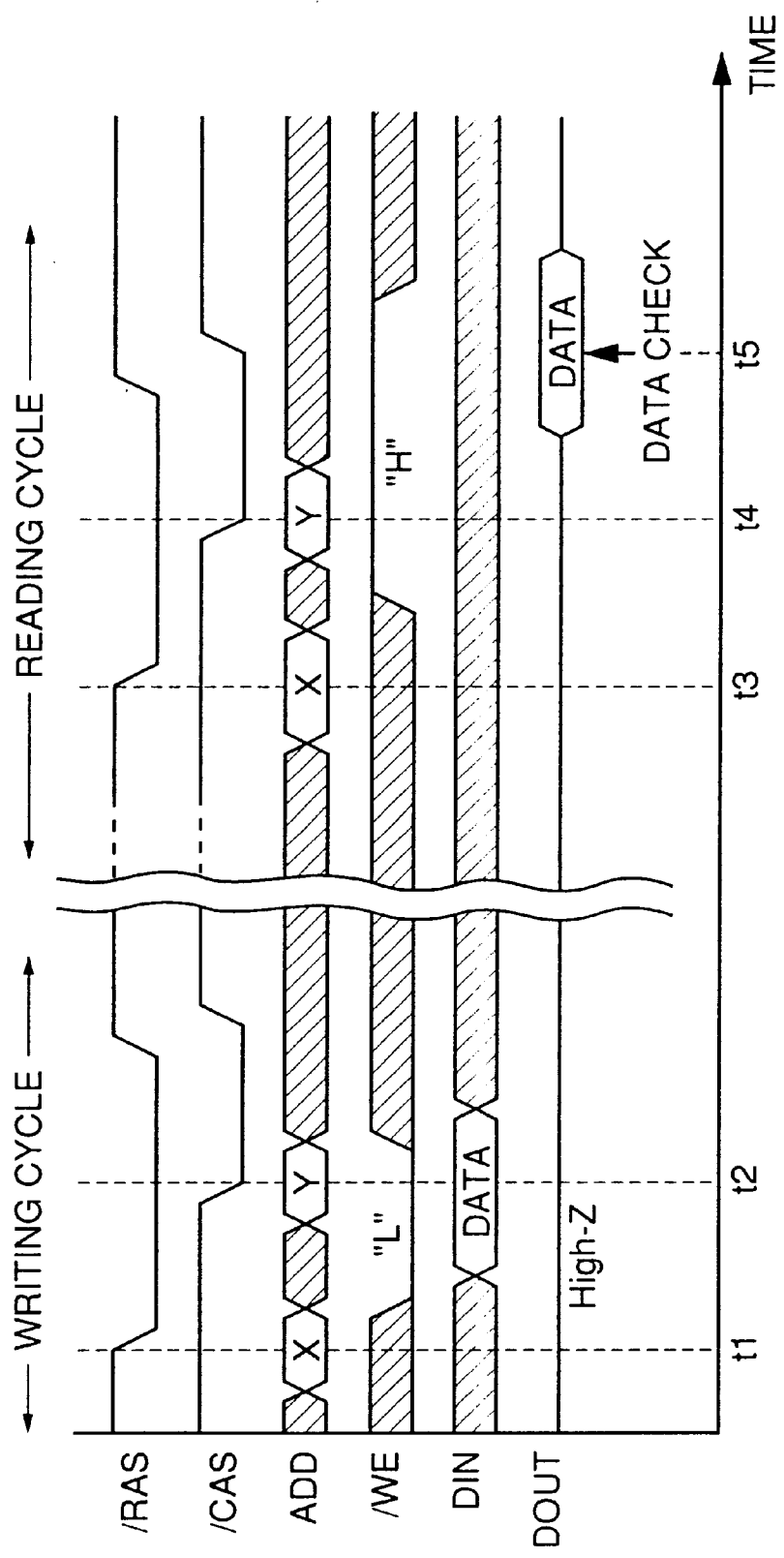
FIG. 16 is a waveform diagram of operation for use in explaining a performance verification test of a conventional semiconductor memory device.
Figure 17:
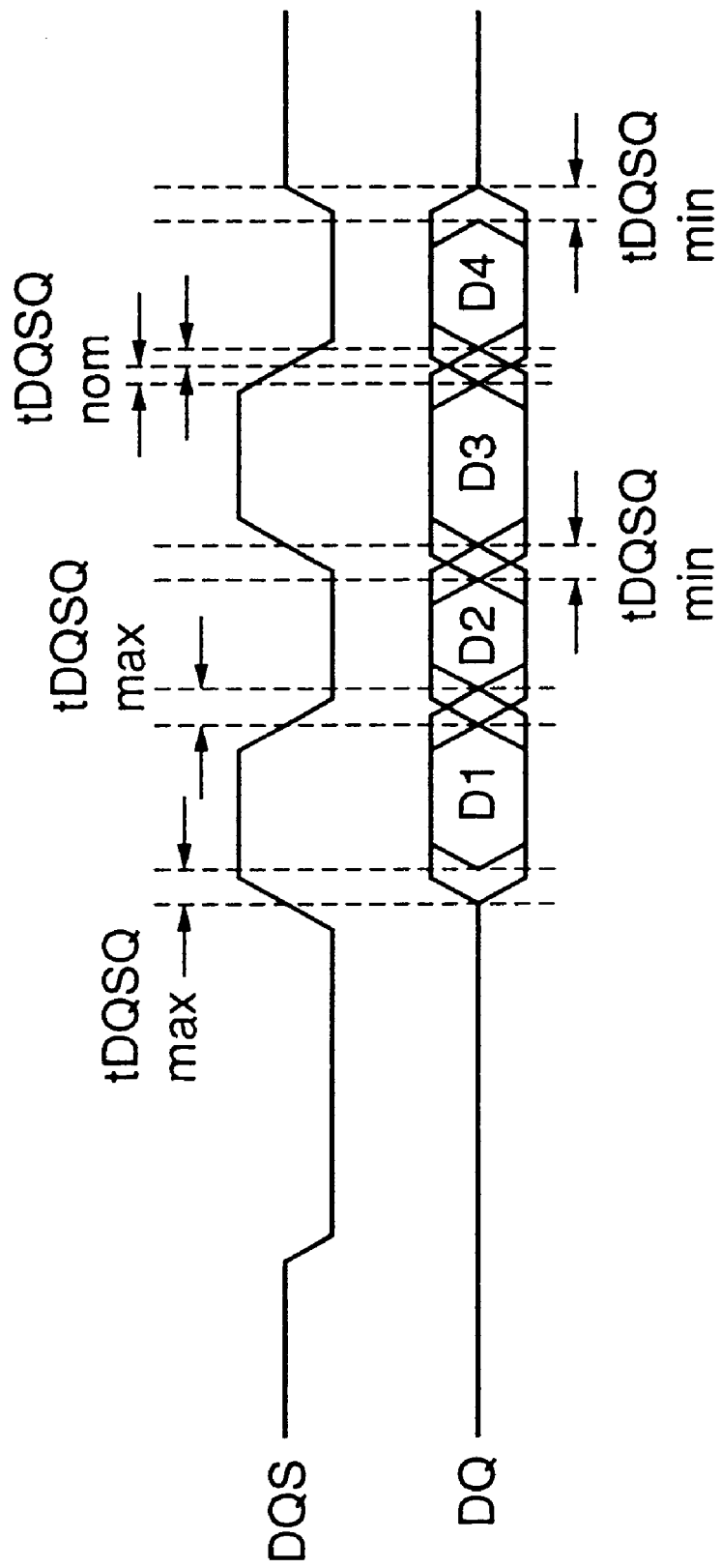
FIG. 17 is a waveform diagram for use in explaining one of standards for DDR SDRAM.

FIG. 14 is a block diagram for use in explaining a third embodiment of the present invention.

With reference to FIG. 14, a test circuit is provided inside a tester 122 in the third embodiment. The tester 122 includes a timing generator 126 for generating a timing reference such as a clock signal, a signal generator 128 for generating address signals A0 to An, control signals /CS, /RAS, /CAS and /WE, a clock signal CLK and a clock enable signal CKE in response to the output of the timing generator 126, a test circuit 132 which receives a data signal DQ and a strobe signal DQS from a memory device 124, and a determination unit 130 for determining a latching result output by the test circuit 132.

Thus providing the test circuit inside the tester 122 attains the same effects as those obtained by the first and the second embodiment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a storage unit which includes a plurality of memory cells and successively outputs data held in said plurality of memory cells and outputs a strobe signal of which signal waveform has a leading edge and a trailing edge synchronizing with said data successively output; and
   a test circuit for accepting said data in response to said strobe signal, said test circuit including
   a first transmission gate unit responsive to said strobe signal to become conductive to transmit said data, and
   a first holding unit for holding said data transmitted by said first transmission gate unit.

2. The semiconductor memory device according to claim 1, wherein said test circuit further includes a first delay circuit for receiving and delaying said strobe signal to apply the delayed strobe signal to said first transmission gate unit.

3. The semiconductor memory device according to claim 2, wherein said first delay circuit has a delay time changed according to a first delay control signal.

4. The semiconductor memory device according to claim 2, wherein said first delay circuit includes:
   a plurality of delay elements connected in series for receiving and delaying said strobe signal,
   a first switch for applying said strobe signal as an output signal to an output node of said first delay circuit, and
   a plurality of second switches for applying outputs of said plurality of delay elements as output signals to said output node, and
   any one of said first switch and said plurality of second switches is selectively set to be conductive in response to the first delay control signal.

5. The semiconductor memory device according to claim 1, wherein said test circuit further includes a second delay circuit for receiving said data from said storage unit and delaying the data to apply the delayed data to said first transmission gate unit.

6. The semiconductor memory device according to claim 5, wherein said second delay circuit has a delay time changed according to a second delay control signal.

7. The semiconductor memory device according to claim 5, wherein said second delay circuit includes:
   a plurality of delay elements connected in series for receiving and delaying said data,
   a third switch for applying said data as an output signal to an output node of said second delay circuit, and a plurality of fourth switches for applying outputs of said plurality of delay elements as output signals to said output node, and any one of said third switch and said plurality of fourth switches is selectively set to be conductive in response to the second delay control signal.

8. The semiconductor memory device according to claim 1, wherein said test circuit further includes:

a second transmission gate unit responsive to said strobe signal to become conductive complementarily to said first transmission gate unit to transmit said data, a second holding unit for holding said data transmitted by said second transmission gate unit, a third transmission gate unit which becomes conductive complementarily to said first transmission gate unit to externally transmit the output of said first holding unit, and a fourth transmission gate unit which becomes conducive complementarily to said third transmission gate unit to externally transmit the output of said second holding unit.

9. A subsidiary device for connecting, to a testing device, a semiconductor memory device which includes a plurality of memory cells and successively outputs data held in said plurality of memory cells and outputs a strobe signal of which signal waveform has a leading edge and a trailing edge synchronizing with said data successively output, comprising:

first and second terminals for receiving said data and said strobe signal from said semiconductor memory device, respectively;

a test circuit responsive to said strobe signal applied through said second terminal for accepting said data applied through said first terminal, said test circuit including a first transmission gate unit responsive to said strobe signal to become conductive to transmit said data, and a first holding unit for holding said data transmitted by said first transmission gate unit; and a third terminal for transmitting the output of said first holding unit to said testing device.

10. The subsidiary device according to claim 9, wherein said test circuit further includes a first delay circuit for receiving and delaying said strobe signal to apply the delayed strobe signal to said first transmission gate unit.

11. The subsidiary device according to claim 10, wherein said first delay circuit has a delay time changed according to a first delay control signal.

12. The subsidiary device according to claim 9, wherein said test circuit further includes a second delay circuit for receiving said data from said storage unit and delaying the data to apply the delayed data to said first transmission gate unit.

13. The subsidiary device according to claim 12, wherein said second delay circuit has a delay time changed according to a second delay control signal.

14. The subsidiary device according to claim 9, wherein said test circuit further includes:

a second transmission gate unit responsive to said strobe signal to become conductive complementarily to said first transmission gate unit to transmit said data, a second holding unit for holding said data transmitted by said second transmission gate unit, a third transmission gate unit which becomes conductive complementarily to said first transmission gate unit to externally transmit the output of said first holding unit, and a fourth transmission gate unit which becomes conducive complementarily to said third transmission gate unit to externally transmit the output of said second holding unit.

15. A testing device for testing a semiconductor memory device which includes a plurality of memory cells and successively outputs data held in said plurality of memory cells and outputs a strobe signal of which signal waveform has a leading edge and a trailing edge synchronizing with said data successively output, comprising:

a timing generator for outputting a timing reference for a test;

a signal generator responsive to the output of said timing generator for outputting a control signal to be applied to said semiconductor memory device and said data to be stored in said semiconductor memory device;

a test circuit responsive to said strobe signal for accepting said data, said test circuit including a first transmission gate unit responsive to said strobe signal to become conductive to transmit said data, and a first holding unit for holding said data transmitted by said first transmission gate unit; and a determination unit for determining whether the output of said first holding unit and an expected value coincide with each other.

16. The testing device according to claim 15, wherein said test circuit further includes a first delay circuit for receiving and delaying said strobe signal to apply the delayed strobe signal to said first transmission gate unit.

17. The testing device according to claim 16, wherein said first delay circuit has a delay time changed according to a first delay control signal.

18. The testing device according to claim 15, wherein said test circuit further includes a second delay circuit for receiving said data from said storage unit and delaying the data to apply the delayed data to said first transmission gate unit.

19. The testing device according to claim 18, wherein said second delay circuit has a delay time changed according to a second delay control signal.

20. The testing device according to claim 15, wherein said test circuit further includes:

a second transmission gate unit responsive to said strobe signal to become conductive complementarily to said first transmission gate unit to transmit said data, a second holding unit for holding said data transmitted by said second transmission gate unit, a third transmission gate unit which becomes conductive complementarily to said first transmission gate unit to externally transmit the output of said first holding unit, and a fourth transmission gate unit which becomes conducive complementarily to said third transmission gate unit to externally transmit the output of said second holding unit.

* * * * *